US012586532B2

(12) United States Patent
Choi et al.

(10) Patent No.: US 12,586,532 B2
(45) Date of Patent: Mar. 24, 2026

(54) DISPLAY APPARATUS

(71) Applicant: LG Display Co., Ltd., Seoul (KR)

(72) Inventors: Sunyoung Choi, Seoul (KR);
Dongchae Shin, Goyang-si (KR); **Mijin
Jeong**, Goyang-si (KR)

(73) Assignee: LG Display Co., Ltd., Seoul (KR)

( * ) Notice: Subject to any disclaimer, the term of this
patent is extended or adjusted under 35
U.S.C. 154(b) by 218 days.

(21) Appl. No.: 18/238,782

(22) Filed: Aug. 28, 2023

(65) Prior Publication Data

US 2024/0071315 A1 Feb. 29, 2024

(30) Foreign Application Priority Data

Aug. 31, 2022 (KR) ........................ 10-2022-0109903

(51) Int. Cl.
*G09G 3/3266* (2016.01)
*G09G 3/3275* (2016.01)
(Continued)

(52) U.S. Cl.
CPC ......... *G09G 3/3266* (2013.01); *G09G 3/3275*
(2013.01); *H10K 59/1213* (2023.02);
(Continued)

(58) Field of Classification Search
CPC .. G09G 3/3233; G09G 3/3266; G09G 3/3275;
G09G 2300/0426;
(Continued)

(56) References Cited

U.S. PATENT DOCUMENTS 9,466,648 B2 10/2016 Kim
RE48,793 E 10/2021 Kim
(Continued)

FOREIGN PATENT DOCUMENTS

CN 114927548 A * 8/2022 .......... H10K 59/126
KR 10-2118920 B1 6/2020
(Continued)

OTHER PUBLICATIONS

Office Action issued on Jan. 19, 2026 in Korean Patent Application
No. 10-2022-0109903 with English translation.

*Primary Examiner* — Stacy Khoo
(74) *Attorney, Agent, or Firm* — Morgan, Lewis &
Bockius LLP

(57) ABSTRACT

A display apparatus includes a substrate including a display
area and a non-display area; a gate line and a data line
disposed on the substrate, wherein the gate line and the data
line intersect each other; a plurality of light-emitting ele-
ments disposed on the gate line and the data line, wherein
each of the plurality of light-emitting elements includes a
first electrode, a light-emissive layer, and a second electrode;
a first thin-film transistor and a second thin-film transistor
disposed under each of the plurality of light-emitting ele-
ments; and a light-blocking layer disposed on the first
thin-film transistor or the second thin-film transistor,
wherein the light-blocking layer and the first electrode are
disposed at the same vertical level, wherein the light-
blocking layer overlaps at least one of the first thin-film
transistor or the second thin-film transistor.

8 Claims, 7 Drawing Sheets

(51) Int. Cl.

| | | |
|---|---|---|
| *H10K 59/121* | (2023.01) | |
| *H10K 59/131* | (2023.01) | |
| *H10K 59/80* | (2023.01) | |

(52) U.S. Cl.
CPC ....... *H10K 59/131* (2023.02); *H10K 59/8792*
(2023.02); *G09G 2320/0233* (2013.01); *G09G 2330/021* (2013.01)

(58) Field of Classification Search
CPC ... G09G 2300/0814; G09G 2300/0819; G09G 2300/0861; G09G 2300/0866; G09G 2310/08; G09G 2320/0233; G09G 2320/045; G09G 2330/021; H10D 86/60; H10K 50/11; H10K 50/81; H10K 50/82; H10K 59/1213; H10K 59/123; H10K 59/124; H10K 59/126; H10K 59/131; H10K 59/8792; H10K 59/8051

See application file for complete search history.

(56) References Cited

U.S. PATENT DOCUMENTS

| | | | |
|---|---|---|---|
| 2014/0022479 A1* | 1/2014 | Hosaka | G02F 1/1337 |
| | | | 257/43 |
| 2017/0184915 A1* | 6/2017 | Yang | G02F 1/13394 |
| 2020/0227508 A1* | 7/2020 | Kim | G09G 3/3233 |
| 2020/0303421 A1 | 9/2020 | Cho et al. | |
| 2020/0381506 A1* | 12/2020 | Kang | G02F 1/1345 |
| 2021/0408061 A1* | 12/2021 | Shin | H10K 59/1213 |
| 2022/0238562 A1 | 7/2022 | Cho et al. | |
| 2022/0320212 A1* | 10/2022 | Gui | H10K 59/8792 |
| 2022/0367772 A1* | 11/2022 | Oh | H10H 20/01 |
| 2023/0200113 A1* | 6/2023 | Jeong | H10K 71/00 |
| | | | 257/40 |

FOREIGN PATENT DOCUMENTS

| | | | | | |
|---|---|---|---|---|---|
| KR | 10-2020-0113132 A | 10/2020 | | | |
| KR | 10-2020-0139301 A | 12/2020 | | | |
| KR | 10-2022-0001984 A | 1/2022 | | | |
| WO | WO-2021233002 A1 * | 11/2021 | ............. | H10K 59/38 |

* cited by examiner

DISPLAY APPARATUS

CROSS-REFERENCE TO RELATED APPLICATION

This application claims priority from Korean Patent Application No. 10-2022-0109903 filed on Aug. 31, 2022 in the Korean Intellectual Property Office, and all the benefits accruing therefrom under 35 U.S.C. 119, the contents of which in its entirety are herein incorporated by reference.

BACKGROUND

Technical Field

The present disclosure relates to a display apparatus. More specifically, the present disclosure relates to a display apparatus capable of preventing light from being incident onto a thin-film transistor.

Discussion of the Related Art

Display apparatuses that display images in TVs, monitors, smart phones, tablet PCs, and notebooks are employed in various schemes and forms.

Among display apparatuses of the various schemes, a liquid crystal display apparatus (LCD) has been used up to now. However, a use and application range of an organic light-emitting display apparatus (OLED) is rapidly expanding.

A display apparatus includes a display panel having a plurality of light-emitting elements or liquid crystals for realizing an image, and a driving transistor for individually controlling an operation of each light-emitting element or liquid crystal.

The liquid crystal display apparatus does not take a self-light-emitting scheme, and thus requires a light source such as a backlight that supplies light at a rear face thereof. The backlight increases a thickness of the liquid crystal display apparatus. Thus, when using the LCD, there is a limit to implementing a display apparatus that can be bent or has various designs.

An organic light-emitting display apparatus having a self-light-emitting element may be implemented to be thinner than a display apparatus with a built-in light source. Since the OLED does not require a separate light source, the organic light-emitting display apparatus can be implemented as a display apparatus that can be bent or has various designs.

In order to drive the light-emitting element of the organic light-emitting display apparatus, a pixel driver circuit composed of a plurality of thin-film transistors and a capacitor is formed in the display apparatus. The pixel driver circuit applies a voltage to the light-emitting element such that the organic light-emitting display apparatus emits light.

SUMMARY

The thin-film transistor for driving the light-emitting element may be easily deteriorated when being exposed to light incident from an outside to an inside of the display apparatus or light generated from the light-emitting element inside the display apparatus.

A threshold voltage value of the deteriorated thin-film transistor is lowered, and thus a current or voltage transmitted to the light-emitting element via the thin-film transistor is changed, so that luminance of the light-emitting element may be lowered.

Accordingly, embodiments of the present disclosure are directed to a display apparatus that substantially obviates one or more of the problems due to limitations and disadvantages of the related art.

Thus, an aspect of the present disclosure is to provide a display apparatus that prevents light from being incident onto the thin-film transistor to suppress luminance degradation.

Another aspect of the present disclosure is to provide a display apparatus having improved display quality in which a uniform common voltage is applied to a plurality of light-emitting elements disposed in the display apparatus.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus comprises a substrate including a display area and a non-display area; a gate line and a data line disposed on the substrate, wherein the gate line and the data line intersect each other; a plurality of light-emitting elements disposed on the gate line and the data line, wherein each of the plurality of light-emitting elements includes a first electrode, a light-emissive layer, and a second electrode; and a first thin-film transistor and a second thin-film transistor disposed under each of the plurality of light-emitting elements.

In this regard, the display apparatus may further include a light-blocking layer disposed on the first thin-film transistor or the second thin-film transistor, wherein the light-blocking layer and the first electrode are disposed at the same vertical level, wherein the light-blocking layer overlaps at least one of the first thin-film transistor and the second thin-film transistor.

In another aspect, a display apparatus comprises a substrate including a display area and a non-display area; a gate line and a data line disposed on the substrate, wherein the gate line and the data line intersect each other; a plurality of light-emitting elements disposed on the gate line and the data line, wherein each of the plurality of light-emitting elements includes a first electrode, a light-emissive layer, and a second electrode; and a driving transistor and a plurality of switching transistors disposed under each of the plurality of light-emitting elements.

In this regard, the display apparatus may further include a light-blocking layer disposed on the driving transistor or the plurality of switching transistor, wherein the light-blocking layer and the first electrode are disposed at the same vertical level, wherein the light-blocking layer overlaps one of the plurality of switching transistors.

Details of other embodiments are included in the detailed descriptions and drawings.

According to the aspects of the present disclosure, the light-blocking layer disposed on the thin-film transistor may prevent the light from being incident to the thin-film transistor, such that deterioration of the thin-film transistor is prevented, and thus luminance deterioration of the display apparatus is prevented. Therefore, display quality of the display apparatus may be improved and reliability thereof may be improved.

Further, the light-blocking layer may be connected to the second electrode of the light-emitting element, and the common voltage may be applied to the second electrode via the common voltage line and the light-blocking layer. Therefore, a uniform common voltage may be applied to an entire area of the display apparatus, such that uniform luminance may be achieved and display quality may be improved.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
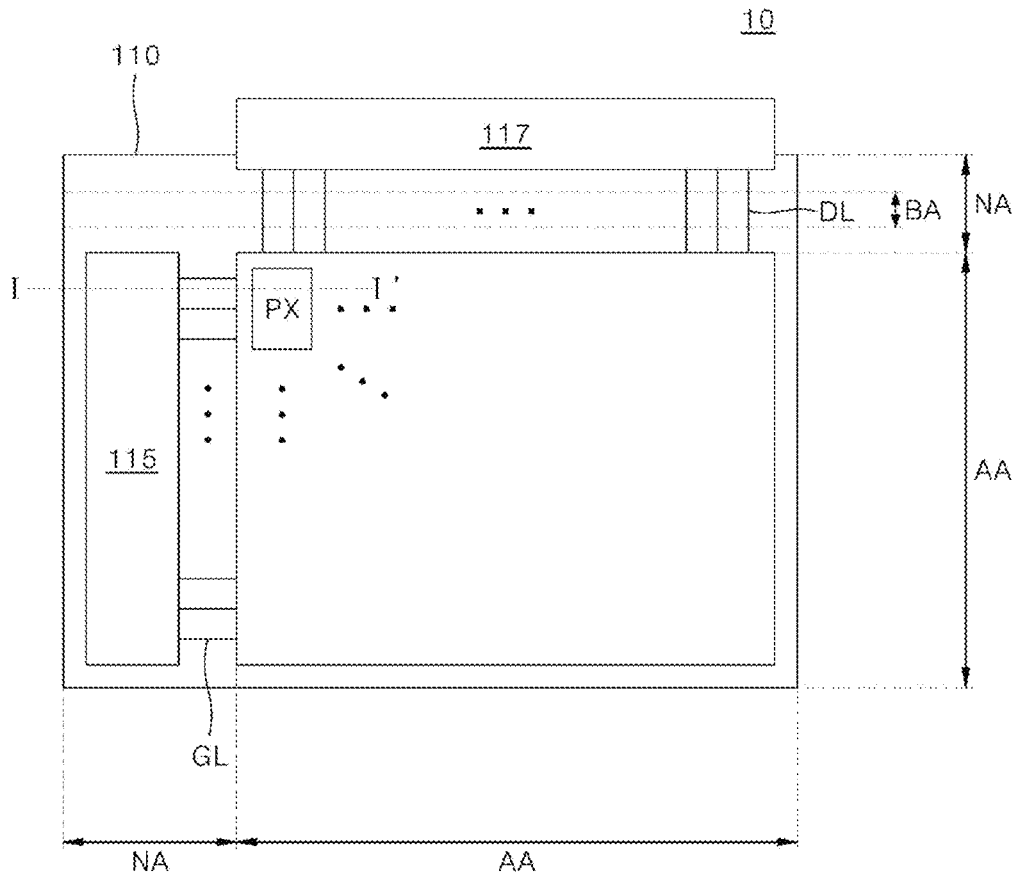
FIG. 1 is a plan view of a display apparatus according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which present disclosure belongs.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A display apparatus as disclosed in the present disclosure may be applied to a liquid crystal display apparatus and an organic light-emitting display apparatus. However, the present disclosure is not limited thereto. The display apparatus as disclosed in the present disclosure may be applied to various display apparatuses such as an LED display apparatus or a quantum dot display apparatus.

Hereinafter, a display apparatus according to an embodiment of the present disclosure will be described with reference to drawings.

FIG. 1 is a plan view of a display apparatus according to an embodiment of the present disclosure.

Referring to FIG. 1, a display apparatus 10 may include a substrate 110, and elements such as a gate driver 115 and a data driver 117 disposed on the substrate 110. The substrate 110 may be divided into a display area AA on which a light-emitting element is disposed and an image is displayed, and a non-display area NA on which the gate driver 115 and the data driver 117 are disposed.

The substrate 110 may be made of glass or plastic, or may be made of a semiconductor material such as a silicon wafer.

The substrate 110 may be made of a plastic material having flexibility. For example, the substrate 110 may be formed in a single layer or multilayer form made of a material such as PI (polyimide), PET (polyethylene terephthalate), PEN (polyethylene naphthalate), PC (polycarbonate), PES (polyethersulfone), PAR (polyarylate), PSF (polysulfone), and COC (cyclic-olefin copolymer). However, the present disclosure is not limited thereto.

The display area AA may be an area in which a plurality of sub-pixels PX are arranged and an image is displayed. Each of the plurality of sub-pixels PX refers to an individual unit emitting light. To this end, a light-emitting element and a pixel driver circuit may be disposed in each of the plurality of sub-pixels PX. For example, when the display apparatus 10 is embodied as an organic light-emitting display apparatus, the light-emitting element may include an organic light-emitting element. When the display apparatus 10 is embodied as a liquid crystal display apparatus, the light-emitting element may include a liquid crystal element. The plurality of sub-pixels PX may include, but are not limited to, a red sub-pixel, a green sub-pixel, a blue sub-pixel, and/or a white sub-pixel.

The non-display area NA may be an area in which an image is not displayed. In the non-display area NA, various lines and driving ICs for driving the plurality of sub-pixels PX disposed in the display area AA may be disposed. For example, at least one of the gate driver 115 and the data driver 117 may be disposed in the non-display area NA.

The non-display area NA may be an area surrounding the display area AA. For example, the non-display area NA may be an area extending from the display area AA and may be an area in which the plurality of sub-pixels PX are not disposed. The non-display area NA where the image is not displayed may be a bezel area, and may further include a bending area BA where the substrate 110 is bent.

The sub-pixel PX of the display area AA may include a thin-film transistor. The thin-film transistor in the display area AA may include a polycrystalline semiconductor material and/or an oxide semiconductor material.

The thin-film transistor may be included in the gate driver 115 of the non-display area NA. The thin-film transistor in the non-display area NA may include a semiconductor layer made of a polycrystalline semiconductor material.

The gate driver 115 may be implemented in a scheme in which a gate driver chip is directly mounted on the substrate 110 or in a GIP (Gate In Panel) scheme in which the gate driver circuit is formed directly in the substrate 110. In the GIP (Gate In Panel) scheme in which the gate driver is circuit directly in the substrate 110, a thin-film transistor using a polycrystalline semiconductor material layer as a semiconductor layer and a thin-film transistor using an oxide semiconductor material layer as a semiconductor layer may constitute a C-MOS and may be formed directly in the substrate 110. As a result, electron mobility may be increased in a channel of the thin-film transistor, thereby implementing a display apparatus with high-resolution and low power consumption.

A plurality of data lines DL and a plurality of gate lines GL may be disposed in display area AA. For example, the plurality of data lines DL may be arranged in a row or column, and the plurality of gate line GL may be arranged in a column or row. In the display panel, the sub-pixel PX may be disposed on an area in which the plurality of data lines DL and the plurality of gate lines GL are disposed.

The gate driver 115 disposed in the non-display area NA may include a gate driver circuit (or a scan driver circuit). The gate driver circuit sequentially supplies a scan signal to the plurality of gate lines GL to sequentially drive the sub-pixels PX in the row of the display area AA.

The gate driver circuit of the gate driver 115 may be composed of a thin-film transistor having a polycrystalline semiconductor layer, or may be composed of a thin-film transistor having an oxide semiconductor layer, or may be composed of a thin-film transistor with a polycrystalline semiconductor layer and a thin-film transistor with an oxide semiconductor layer.

The gate driver circuit may include a shift register, a level shifter, etc. The gate driver 115 including the gate driver circuit may sequentially supply the scan signal of an on voltage or an off voltage to the plurality of gate lines GL.

When a specific gate line GL is opened by the gate driver 115 including the gate driver circuit, the data driver circuit 117 converts image data into an analog data voltage and supplies the data voltage to the plurality of data lines DL.

The display apparatus 10 may include multiple scan lines and multiple light-emission control lines. The multiple scan lines and the multiple light-emission control lines may deliver different types of gate signals (scan signals and light-emission control signals) to gate nodes of different types of thin-film transistors (switching transistors and driving transistors).

The gate driver 115 including the gate driver circuit may include a scan driver circuit that outputs the scan signals to a plurality of scan lines as one type of the gate line GL, and a light-emission driver circuit that outputs the light-emission control signals to a plurality of light-emission control lines as the other type of the gate line GL.

The data lines DL may extend through the bending area BA. Various data lines DL may be connected to data pads.

The bending area BA may be an area where the substrate 110 is bent. The substrate 110 may be maintained in a flat state except for the bending area BA.

Figure 2:
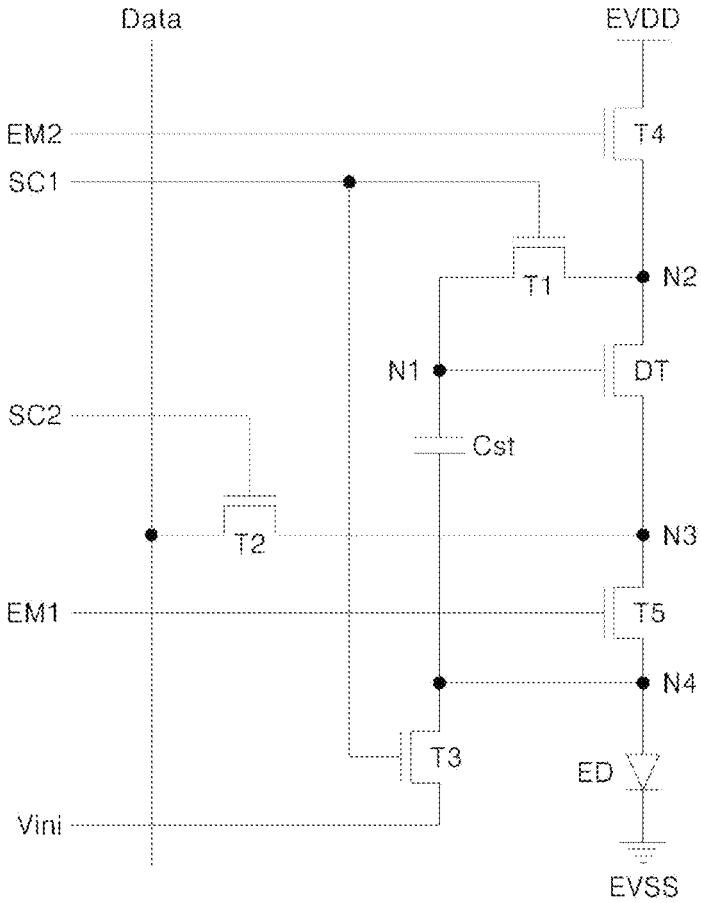
FIG. 2 is a circuit diagram showing a pixel driver circuit according to an embodiment of the present disclosure.

FIG. 2 is a circuit diagram showing a pixel driver circuit according to an embodiment of the present disclosure.

Referring to FIG. 2, each of a plurality of sub-pixels PX of the display apparatus 10 may include a light-emitting element ED and a pixel driver circuit for driving the light-emitting element ED.

The pixel driver circuit of the sub-pixel PX may have a 6T1C structure (6 Transistors 1 Capacitor). However, the present disclosure is not limited thereto. The pixel driver circuit of the sub-pixel PX may be configured such that transistors disposed in the pixel driver circuit are embodied as an N-type transistor, a P-type transistor, or N-type and P-type transistors.

The pixel driver circuit of the sub-pixel PX may include a driving element for supplying driving current to the light-emitting element ED, a scan element for delivering a voltage Vini necessary for a display operation to the sub-pixel PX at a predetermined timing according to the scan signal, a light-emission control element that controls whether the light-emitting element ED emits light, and a storage capacitor Cst that stores therein the voltage (Vini, etc.) necessary for the display operation.

The driving element may include a driving transistor DT. The driving transistor DT may be referred to as a first thin-film transistor. The scan element may include a first switching transistor T1, a second switching transistor T2, and a third switching transistor T3. The light-emission control element may include a fourth switching transistor T4 (or a first light-emission control transistor) and a fifth switching transistor T5 (or a second light-emission control transistor). Each of the first to fifth switching transistors may be referred to as a second thin-film transistor.

According to an embodiment of the present disclosure, the pixel driver circuit may include the first thin-film transistor as the driving transistor DT, and a plurality of second thin-film transistors as the switching transistors T1 to T5.

The light-emitting element ED may include a first electrode (anode electrode or pixel electrode) and a second electrode (cathode electrode or common electrode). The first electrode may act as a fourth node N4 or be connected to the fourth node N4. A second driving voltage EVSS (or a common voltage) as a low potential voltage may be applied to the second electrode. For example, the light-emitting element ED may be disposed between and electrically connected to the fourth node N4 and a line to which the second driving voltage EVSS is applied.

The driving transistor DT may be connected to a first node N1, a second node N2, and a third node N3, and may be controlled according to a voltage of the first node N1. The driving transistor DT may include a first gate electrode, a first drain electrode, and a first source electrode. The first gate electrode of the driving transistor DT may be connected to the first node N1, the first drain electrode (or a drain node) thereof may be connected to the second node N2, and the first source electrode thereof may be connected to the third node N3. For example, a first driving voltage EVDD as a high potential voltage may be applied to the first drain electrode of the driving transistor DT. The first source electrode of the driving transistor DT may be electrically connected to the first electrode (or the anode electrode) of the light-emitting element ED.

The first switching transistor T1 may be controlled based on a first scan signal SC1 and may be connected to and disposed between the first node N1 and the second node N2. The first switching transistor T1 may include a second gate electrode, a second drain electrode, and a second source electrode. The first scan signal SC1 may be applied to the second gate electrode of the first switching transistor T1. The second drain electrode may be connected to the second node N2, and the second source electrode may be connected to the first node N1.

The second switching transistor T2 may be controlled based on a second scan signal SC2 and may be connected to and disposed between a line to which data voltage Data is applied and the third node N3. The second scan signal SC2 may be applied to a gate electrode of the second switching transistor T2. The data voltage Data may be applied to a drain electrode thereof, and a source electrode thereof may be connected to the third node N3.

The third switching transistor T3 may be controlled based on the first scan signal SC1 and may be connected to and disposed between a line to which an initialization voltage Vini is applied and the fourth node N4. The first scan signal SC1 may be applied to a gate electrode of the third switching transistor T3, the initialization voltage Vini may be applied to a drain electrode thereof, and a source electrode of the third switching transistor T3 may be connected to the fourth node N4.

The storage capacitor Cst may be connected to and disposed between the first node N1 and the fourth node N4. The storage capacitor Cst may store therein and maintain the data voltage Data during one frame.

The fourth switching transistor T4 may be controlled based on a second light-emission control signal EM2 and may be connected to and disposed between a line to which the first driving voltage EVDD as a high potential voltage is applied and the second node N2. The second light-emission control signal EM2 may be applied to a gate electrode of the fourth switching transistor T4. The first driving voltage EVDD may be applied to a drain electrode thereof, and a source electrode thereof may be connected to the second node N2.

The fifth switching transistor T5 may be controlled based on a first light-emission control signal EM1 and may be connected to and disposed between the third node N3 and the fourth node N4. The fifth switching transistor T5 may include a third gate electrode, a third drain electrode, and a third source electrode. The first light-emission control signal EM1 may be applied to the third gate electrode of the fifth switching transistor T5, the third drain electrode may be connected to the third node N3, and the third source electrode may be connected to the fourth node N4.

Figure 3:
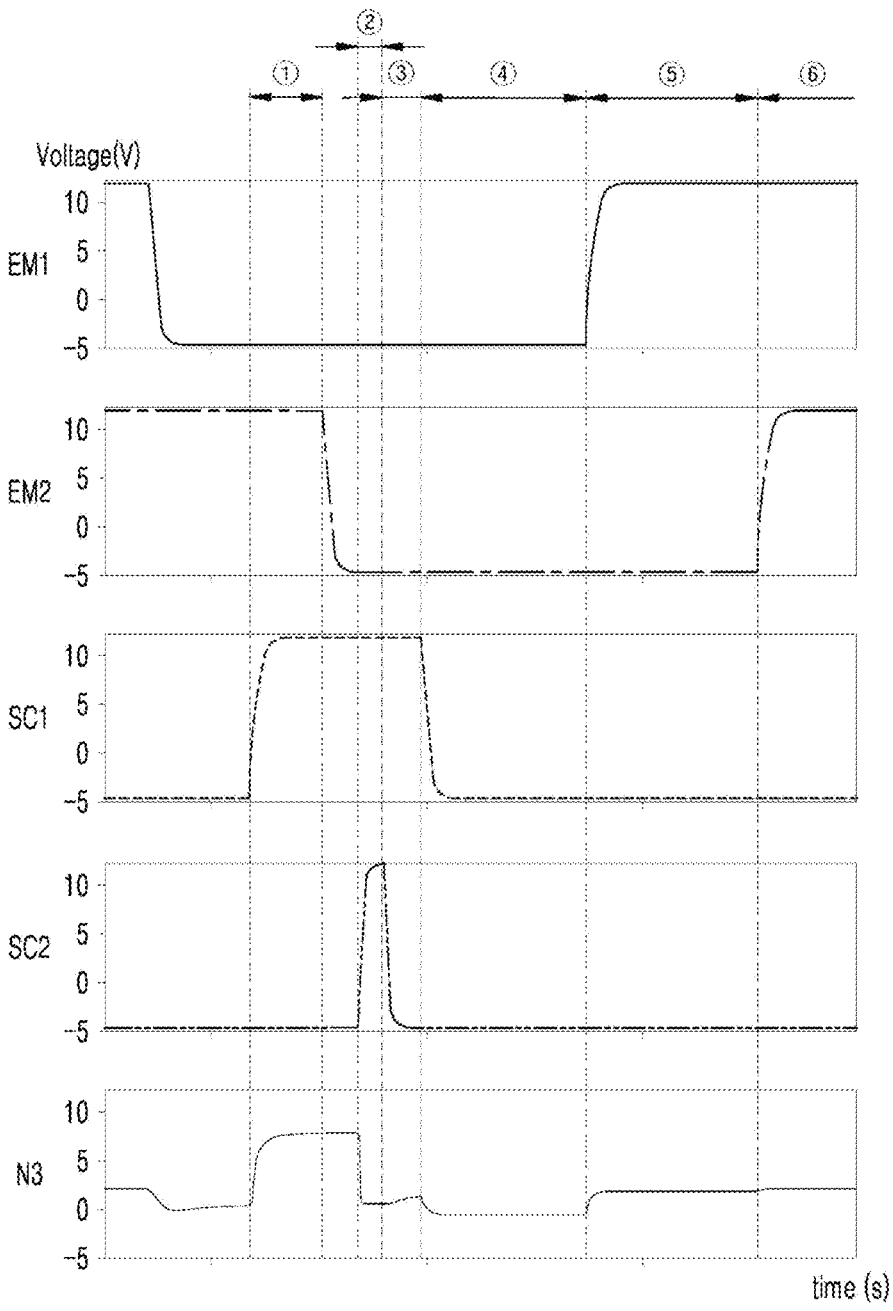
FIG. 3 is a waveform diagram of gate signals and a voltage of a specific node of a pixel driver circuit according to an embodiment of the present disclosure.

FIG. 3 is a waveform diagram of gate signals and a voltage of a specific node of a pixel driver circuit according to an embodiment of the present disclosure.

Referring to the waveform diagram of FIG. 3 according to the pixel driver circuit of FIG. 2, the operation of the pixel driver circuit according to an embodiment of the present disclosure may be divided into a first period ①, a second period ②, a third period ③, a fourth period ④, a fifth period ⑤ and a sixth period ⑥. For example, during the first to sixth periods ①, ②, ③, ④, ⑤, and ⑥, the data voltage Data may be written to each of the sub-pixels PX arranged in an n-th horizontal line, and each sub-pixel PX may emit light. A time duration of each of the first to sixth periods ①, ②, ③, ④, ⑤, and ⑥ may vary in various ways depending on embodiments.

The gate signals input to the pixel driver circuit may include the first light-emission control signal EM1, the second light-emission control signal EM2, the first scan signal SC1, and the second scan signal SC2 applied via the gate lines GL.

The first light-emission control signal EM1 may have a gate high voltage of a first driving voltage level during the fifth and sixth periods ⑤ and ⑥, and may have a gate low voltage of a second driving voltage level different from the first driving voltage level during the first to fourth periods ①, ②, ③, and ④.

The second light-emission control signal EM2 may have a gate high voltage of the first driving voltage level during the first and sixth periods ① and ⑥, and may have a gate low voltage of the second driving voltage level during the second to fifth periods ②, ③, ④, and ⑤.

The first scan signal SC1 may have a gate high voltage of the first driving voltage level during the first to third periods ①, ②, and ③, and may have a gate low voltage of the second driving voltage level during the fourth to sixth periods ④, ⑤, and ⑥.

The second scan signal SC2 may have a gate high voltage of the first driving voltage level during the second period ②, and may have a gate low voltage of the second driving voltage level during the first, and third to sixth periods ①, ③, ④, ⑤, and ⑥.

The moment the first period ① starts, the first scan signal SC1 rises and has a gate high voltage, the second light-emission control signal EM2 is in a state where the gate high voltage is maintained, and each of the first light-emission control signal EM1 and the second scan signal SC2 is maintained at the gate low voltage.

During the first period ①, the fourth switching transistor T4 is turned on as the second light-emission control signal EM2 maintains the gate high voltage state. As the first scan signal SC1 changes to the gate high voltage, the first switching transistor T1 is turned on. Thus, the first driving voltage EVDD may be applied to the first node N1 as the gate node of the driving transistor DT via the fourth switching transistor T4 and the first switching transistor T1. Accordingly, the driving transistor DT may be turned on.

Further, during the first period ①, as the first scan signal SC1 changes to the gate high voltage, the third switching transistor T3 may be turned on, and thus the initialization voltage Vini may be applied to the fourth node N4 via the third switching transistor T3.

Accordingly, the anode electrode of the light-emitting element ED connected to the fourth node N4 is initialized with the initialization voltage Vini, and the first driving voltage EVDD and the initialization voltage Vini may be applied to both ends the storage capacitor Cst disposed between and connected to the first node N1 and the fourth N4.

The moment the second period ② begins, the second scan signal SC2 rises and has a gate high voltage, and the first scan signal SC1 is maintained at the gate high voltage, the first light-emission control signal EM1 is maintained at the gate low voltage, and the second light-emission control signal EM2 falls down to the gate low voltage.

During the second period ②, as the first scan signal SC1 maintains the gate high voltage state, the first switching transistor T1 and the third switching transistor T3 are turned on. As the second scan signal SC2 is changed to the gate high voltage, the second switching transistor T2 is turned on. Thus, the data voltage Data may be applied to the third node N3 as the source node of the driving transistor DT via the second switching transistor T2.

The driving transistor DT is in a diode-connection state where the first node N1 and the second node N2 are connected to each other. Thus, sampling of the threshold voltage of the driving transistor DT starts and thus the voltage of the first node N1 rises above the data voltage Data.

The moment the third period ③ begins, the first scan signal SC1 is maintained at the gate high voltage, the second scan signal SC2 falls down to the gate low voltage, and each of the first and second light-emission control signals EM1 and EM2 is maintained at the gate low voltage.

During the third period ③, the second scan signal SC2 is converted to the gate low voltage state, whereas the first scan signal SC1 maintains the gate high voltage state. Thus, the diode-connection state of the driving transistor DT in which the first node N1 and the second node N2 are connected to each other is maintained, such that a period during which the threshold voltage of the driving transistor DT is sampled increases. Accordingly, the gate node of the driving transistor DT has a sum of the data voltage Data and the threshold voltage of the driving transistor DT. As the second switching transistor T2 is turned off, a voltage of the floated third node N3 may rise to a certain level.

Further, during the third period ③, the storage capacitor Cst may be charged based on a potential difference between the sum voltage of the data voltage Data and the threshold voltage and the initialization voltage Vini.

The moment the fourth period ④ begins, the first scan signal SC1 falls down to a gate low voltage, and each of the first and second light-emission control signals EM1 and EM2 and the second scan signal SC2 may be maintained at a gate low voltage. During the fourth period ④, all of the first to fifth thin-film transistors T1, T2, T3, T4, and T5 in the pixel driver circuit may be turned off.

Accordingly, each of the first node N1, the second node N2, the third node N3, and the fourth node N4 subjected to the sampling or writing operation during the second and third periods ② and ③ is floated, and the voltage of each of the nodes is maintained in a non-changed manner.

At the moment when the fifth period ⑤ starts, each of the first and second scan signals SC1 and SC2 and the second light-emission control signal EM2 maintains the gate low voltage state, and the first light-emission control signal EM1 rises so as to have the gate high voltage.

During the fifth period ⑤, the fifth switching transistor T5 may be turned on as the first light-emission control signal EM1 is changed to the gate high voltage. At this time, the voltage of the fourth node N4 connected to the anode electrode of the light-emitting element ED may be boosted while a potential difference (Data+Vth−Vini) across the storage capacitor Cst is maintained.

When the boosted voltage of the fourth node N4 becomes higher than or equal to a voltage value at which the driving current can flow through the light-emitting element ED (that is, the light-emitting element ED can emit light), the light-emitting element ED can emit light. The minimum voltage value at which the driving current may flow through the light-emitting element ED may be a voltage (EVSS+Vth) as a sum of the threshold voltage Vth of the light-emitting element ED and the second driving voltage EVSS. In this regard, when the applied data voltage Data is a black signal, the boosted voltage of the fourth node N4 does not exceed the threshold voltage of the light-emitting element ED, such that the light-emitting element ED cannot emit light.

At the moment the sixth period ⑥ starts, the second light-emission control signal EM2 rises and thus has a gate high voltage, the first light-emission control signal EM1 is in a state where the gate high voltage is maintained, and each of the first and second scan signals SC1 and SC2 is maintained at the gate low voltage.

During the sixth period ⑥, the fourth switching transistor T4 may be turned on as the second light-emission control signal EM2 is changed to the gate high voltage. Accordingly, the driving current is supplied to the light-emitting element ED via the fourth switching transistor T4, the driving transistor DT, and the fifth switching transistor T5 so that the light-emitting element ED may emit light. As described above, when the applied data voltage Data is a black signal, the boosted voltage of the fourth node N4 does not exceed the threshold voltage of the light-emitting element ED, such that the light-emitting element ED may not emit light.

According to an embodiment of the present disclosure, maintaining the gate high voltage of the first scan signal SC1 for a certain period of time during the third period ③ may allow the period during which the threshold voltage of the driving transistor DT is sampled to increase. Thus, image quality defects such as stains, afterimages, and crosstalk may be suppressed.

Figure 4:
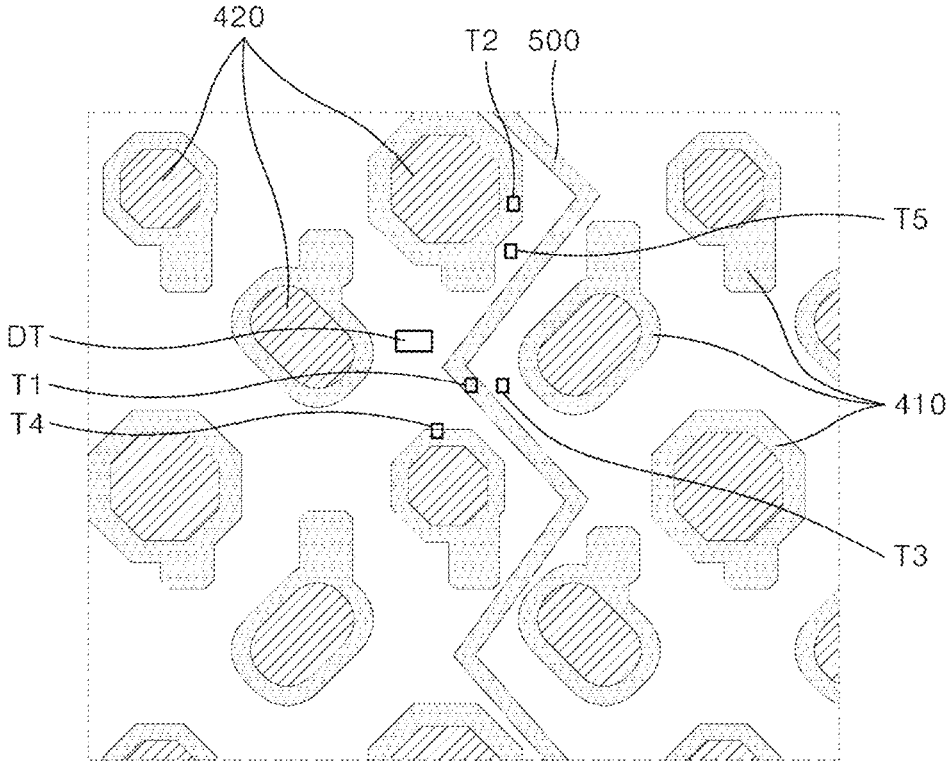
FIG. 4 is a plan view showing a thin-film transistor and a light-blocking layer according to an embodiment of the present disclosure.

FIG. 4 is a plan view showing a thin-film transistor and a light-blocking layer according to an embodiment of the present disclosure. FIG. 4 is an enlarged plan view of a certain area including a plurality of thin-film transistors and a light-blocking layer in the display area AA.

Referring to FIG. 4, the sub-pixel PX may include a light-emitting element and a pixel driver circuit. The light-emitting element may include a first electrode 410, a light-emissive layer 420, and a second electrode. The pixel driver circuit may include the driving transistor DT and the plurality of switching transistors T1 to T5. The driving transistor DT may be the first thin-film transistor, the first switching transistor T1 may be the second thin-film transistor, and the fifth switching transistor T5 may be the third thin-film transistor.

Each of the driving transistor DT and the plurality of switching transistors T1 to T5 may include a gate electrode, a semiconductor layer, a source electrode, and a drain electrode. A size of each thin-film transistor may vary depending on a size of the semiconductor layer.

Since the driving transistor DT and the first switching transistor T1 are connected to the storage capacitor Cst and the plurality of lines for driving the light-emitting element ED, the driving transistor DT and the first switching transistor T1 continuously operate according to the driving voltage and the capacitance variation of the storage capacitor Cst. Thus, a larger amount of a load than an amount of a load applied to the other switching transistors T2 to T5 may be applied to the driving transistor DT and the first switching transistor T1. Therefore, the driving transistor DT and the first switching transistor T1 may deteriorate more rapidly than the other switching transistors T2 to T5.

When each of the driving transistor DT and the first switching transistor T1 includes an oxide semiconductor layer, the thin-film transistor may be further deteriorated due to light incident on the oxide semiconductor layer.

Light incident on the oxide semiconductor layer may include external light coming into the display apparatus 10 from the outside or internal light generated from the light-emitting element inside the display apparatus 10. The thin-film transistor using an oxide semiconductor layer may have excellent leakage current characteristics compared to the thin-film transistor using a polycrystalline semiconductor layer but may be easily deteriorated due to light and thus the characteristics thereof may be changed.

When each of the driving transistor DT and the first switching transistor T1 is easily deteriorated, the threshold voltage Vth of each of the driving transistor DT and the first switching transistor T1 may change. Thus, each of the driving transistor DT and the first switching transistor T1 may operate when a low voltage is applied thereto. The light-emitting element ED connected to the first switching transistor T1 may emit light at low luminance or may emit light when no driving signal is applied thereto.

Therefore, in order to prevent deterioration of the driving transistor DT and the first to fifth switching transistors T1 to T5 due to the incident light, the light should be prevented from being incident onto the driving transistor DT and the first to fifth switching transistors T1 to T5. To this end, a light-blocking layer 500 may be formed on the driving transistor DT, and the first to fifth switching transistors T1 to T5 to prevent the light from being incident onto the driving transistor DT and the first to fifth switching transistors T1 to T5.

The light-blocking layer 500 may be formed on the driving transistor DT or the first to fifth switching transistors T1 to T5. The light-blocking layer 500 may be disposed to overlap one or more of the driving transistor DT and the first to fifth switching transistors T1 to T5.

The light-blocking layer 500 may be made of the same material as that of the first electrode 410 and may be disposed in the same layer as a layer in which the first electrode 410 is disposed. Or, the light-blocking layer 500 and the first electrode 410 may be disposed at the same vertical level. Thus, the light-blocking layer 500 may be formed on the driving transistor DT and the first to fifth switching transistors T1 to T5. The light-blocking layer 500 may be insulated or spaced from the first electrode 410 so as not to electrically affect the first electrode 410.

Since the driving transistor DT and the first switching transistor T1 are degraded more rapidly than the other switching transistors, the light-blocking layer 500 may be disposed to overlap the driving transistor DT and the first switching transistor T1, and may be disposed not to overlap the other switching transistors T2 to T5. The light-blocking layer 500 may be disposed on some thin-film transistors and may not be disposed on the other thin-film transistors so that the deteriorations of the thin-film transistors may be similar to each other in consideration of the deterioration of each of the thin-film transistors.

Since the degradation of the first switching transistor T1 may be larger than that of the driving transistor DT, the light-blocking layer 500 may be disposed to overlap only the first switching transistor T1. For example, the light-blocking layer 500 may overlap the driving transistor DT or one of the plurality of switching transistors, and may not overlap the other switching transistors except for the one of the plurality of switching transistors.

An arrangement structure of the light-blocking layer 500 is not limited thereto, and various types of arrangement structures may be applied thereto.

The light-blocking layer 500 may have a line shape, may continuously extend without a discontinuity and may be disposed between adjacent ones of a plurality of light-emitting elements, and may overlap one or more of the driving transistor DT and the first to fifth switching transistors T1 to T5.

In FIG. 4, only one light-blocking layer 500 extending in a form of a line is shown. However, the arrangement structure of the light-blocking layer 500 is not limited thereto. The light-blocking layer 500 extending in the form of a line may be disposed between adjacent sub-pixels PX. A plurality of light-blocking layers 500 may be disposed between sub-pixels PX. The light-blocking layer 500 may be disposed in various forms along first and second horizontal directions intersecting each other.

The light-blocking layer 500 extending in a form of a line may be connected to the second electrode of the light-emitting element to apply a common voltage thereto. For example, the light-blocking layer 500 extending in the form of the line may extend from the non-display area NA of the substrate 110 to the display area AA thereof. A portion of the light-blocking layer 500 disposed in the non-display area NA may be connected to a common voltage line, while a portion of the light-blocking layer 500 disposed in the display area AA may be connected to the second electrode.

The light-blocking layer 500 and the second electrode may be connected to each other in a plurality of areas spaced from each other by a certain distance. The second electrode may be connected to the common voltage line and the light-blocking layer 500 and receive a common voltage therefrom. Thus, a uniform common voltage may be distributed over an entire area of the second electrode.

The common voltage line may be formed in the non-display area NA to apply the common voltage to the second electrode, and the common voltage line may be connected to both the second electrode and the light-blocking layer 500.

Figure 5:
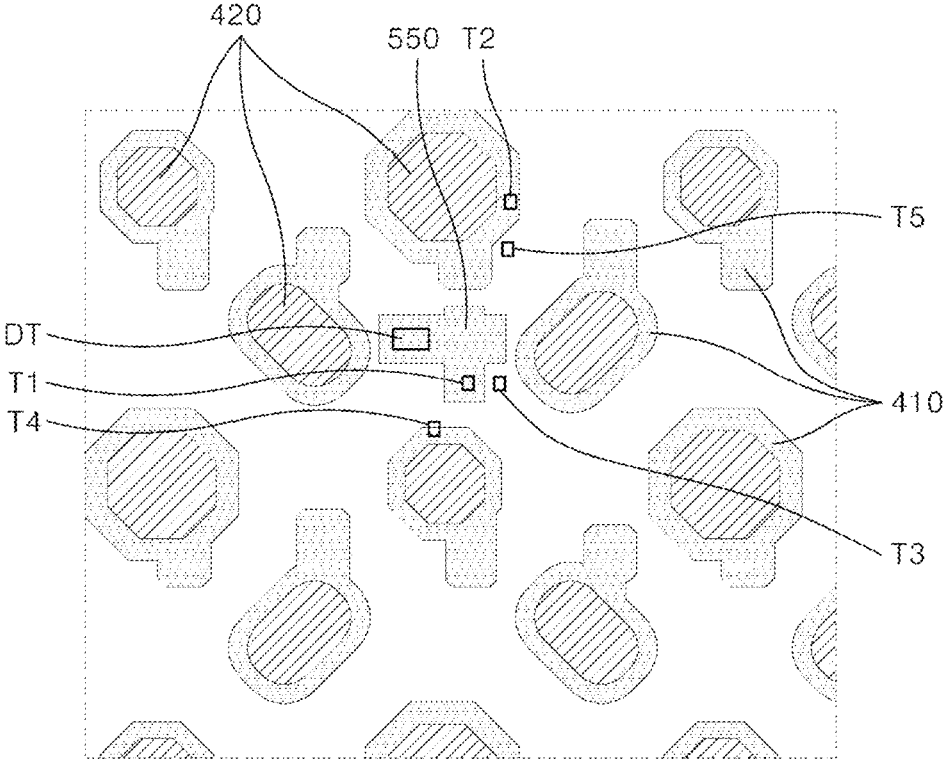
FIG. 5 is a plan view showing a thin-film transistor and a light-blocking layer according to another embodiment of the present disclosure.

FIG. 5 is a plan view showing a thin-film transistor and a light-blocking layer according to another embodiment of the present disclosure. FIG. 5 is an enlarged plan view of a certain area including a plurality of thin-film transistors and a light-blocking layer in the display area AA.

Referring to FIG. 5, the sub-pixel PX may include a light-emitting element ED and a pixel driver circuit. The light-emitting element ED may include the first electrode 410, the light-emissive layer 420, and the second electrode, and the pixel driver circuit may include the driving transistor DT, and the first to fifth switching transistors T1 to T5.

The light-blocking layer 550 may be made of the same material as that of the first electrode 410 and may be disposed in the same layer as a layer in which the first electrode 410 is disposed. Thus, the light-blocking layer 550 may be formed on the driving transistor DT and the first to fifth switching transistors T1 to T5. The light-blocking layer 550 may be insulated from the first electrode 410 so as not to electrically affect the first electrode 410.

The light-blocking layer 550 may be disposed to overlap one or more of the driving transistor DT and the first to fifth switching transistors T1 to T5.

Since the degradation of the first switching transistor T1 may be larger than that of the driving transistor DT due to a larger amount of a load applied to the first switching transistor T1 than the other switching transistors T2 to T5, the light-blocking layer 550 may be disposed to overlap only the first switching transistor T1.

An arrangement structure of the light-blocking layer 550 is not limited thereto, and various types of arrangement structures may be applied thereto. The light-blocking layer 550 may be disposed to overlap all of the driving transistor DT and the first to fifth switching transistors T1 to T5.

According to an embodiment of the present disclosure, in order that the light-blocking layer 550 effectively blocks light incident from the outside to the inside of the display apparatus, or light generated from the light-emitting element inside the display apparatus, the light-blocking layer 550 may be disposed so as not to be connected to the common voltage line and the second electrode. A degree of freedom in terms of the position of the light-blocking layer 550 in FIG. 5 may be greater, compared to that in the embodiment of FIG. 4.

In FIG. 5, the light-blocking layer 550 may extend in a cross shape to prevent light from being incident on each transistor. However, the present disclosure is not limited thereto and the light-blocking layer 550 may have various forms.

In FIG. 5, only one light-blocking layer 550 is shown. However, the arrangement structure of the light-blocking layer 550 is not limited thereto. The light-blocking layer 550 may be disposed between the sub-pixels PX. A plurality of light-blocking layers 550 may be disposed between sub-pixels PX. The light-blocking layer 550 may have various forms according to a purpose of blocking the light.

A size of the first electrode 410 may be larger than a size of the light-emissive layer 420. The second switching transistor T2 or the fourth switching transistor T4 may be placed under the first electrode 410. Thus, the first electrode 410 instead of the light-blocking layer 550 may prevent light from being incident onto the second switching transistor T2 or the fourth switching transistor T4. Therefore, the light-blocking layer 550 may not be disposed on the second switching transistor T2 or the fourth switching transistor T4.

Deterioration of each of the third switching transistor T3 and the fifth switching transistor T5 may be smaller than that of each of the other thin-film transistors. Thus, in order that the deteriorations of the thin-film transistors are substantially equal to each other, the light-blocking layer 550 may not be disposed on the third switching transistor T3 and the fifth switching transistor T5. In order that the deteriorations of the thin-film transistors are substantially equal to each other, the light-blocking layer 550 may be disposed to overlap only a partial area of each of the third switching transistor T3 and the fifth switching transistor T5.

Figure 6:
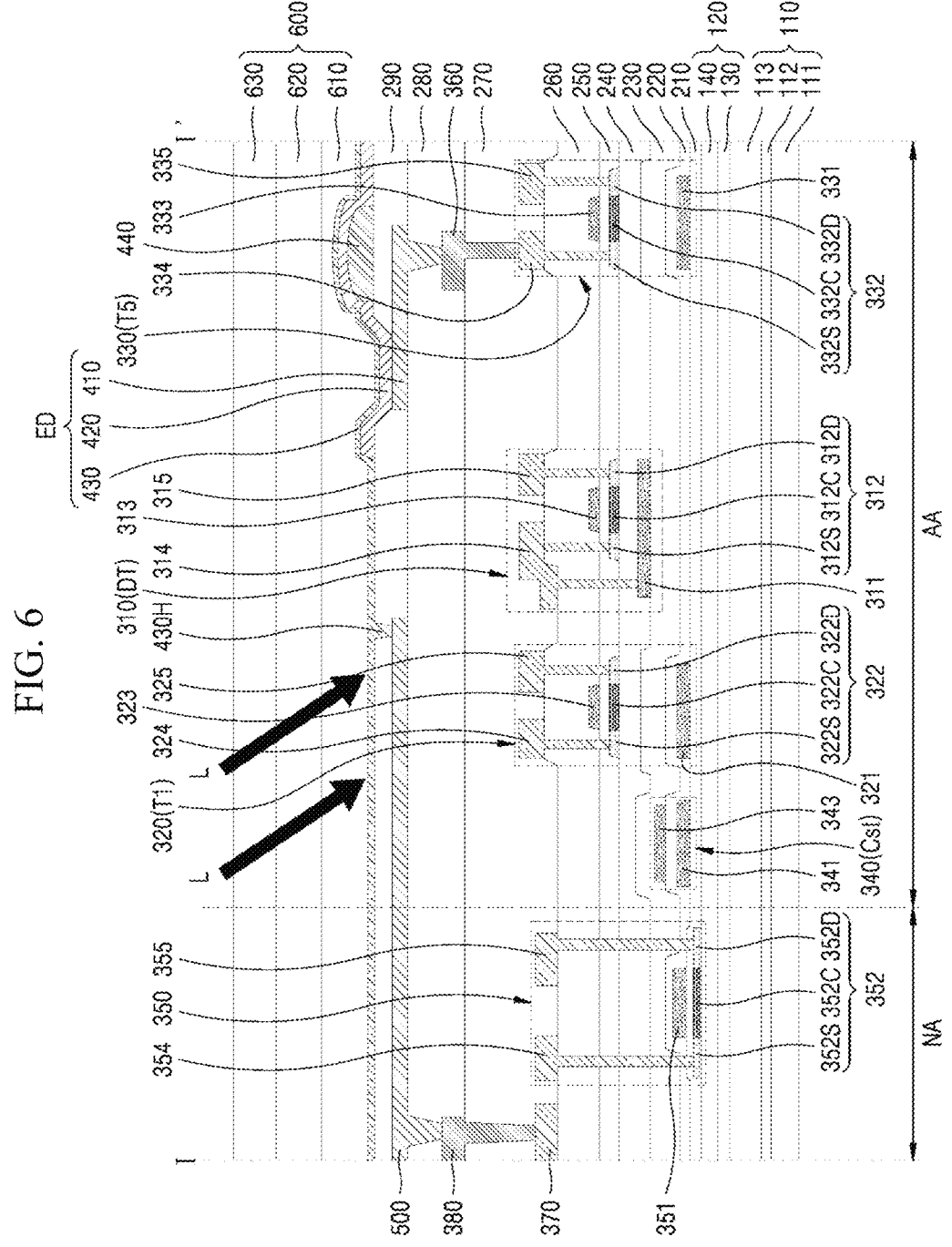
FIG. 6 is a cross-sectional view along a line I-I' of FIG. 1, and is a cross-sectional view showing a thin-film transistor and a light-blocking layer according to the embodiment of FIG. 4.

FIG. 6 is a cross-sectional view along a line I-I' of FIG. 1. FIG. 6 shows a thin-film transistor and a light-blocking layer according to the embodiment of FIG. 4.

Referring to FIG. 6, the pixel driver circuit of the display area AA may include a first thin-film transistor 310 (or the driving transistor DT), a second thin-film transistor 320 (or the first switching transistor T1), a third thin-film transistor 330 (or the fifth switching transistor T5), and a storage capacitor 340 (or the storage capacitor Cst). At least one switching transistor (or the fourth thin-film transistor) 350 may be included in the gate driver 115 of the non-display area NA.

One sub-pixel PX may include a substrate 110, a pixel driver circuit formed on the substrate 110, and a light-emitting element electrically connected to the pixel driver circuit. The pixel driver circuit refers to an array that includes the driving transistor DT or 310, the switching transistors T1 and T5 or 320 and 330, and the storage capacitor 340 or Cst and drives one sub-pixel PX. The light-emitting element ED refers to an array including the anode electrode 410, the cathode electrode 430 and the light-emissive layer 420 disposed therebetween, and emitting light. The pixel driver circuit and the light-emitting element ED may be insulated from each other via a planarization layer.

According to an embodiment of the present disclosure, each of the driving transistor DT (or the first thin-film transistor 310) and the first switching transistor T1 (or the second thin-film transistor 320) includes an oxide semiconductor material layer (or a semiconductive oxide material layer) as a semiconductor layer 322. The thin-film transistor using the oxide semiconductor material layer as the semiconductor layer thereof has an excellent leakage current blocking effect and thus may reduce power consumption, and a manufacturing cost thereof is relatively inexpensive compared to that of a thin-film transistor using a polycrystalline semiconductor material layer as a semiconductor layer thereof.

The substrate 110 may be composed of a stack of multilayers in which organic and inorganic films are alternately stacked on top of each other. For example, the substrate 110 may be formed by alternately stacking and organic layer 111 made of polyimide, an inorganic layer 112 made of silicon oxide ($SiO_2$) and an organic layer 113 made of polyimide. However, embodiments of the present disclosure are not limited thereto.

A lower buffer layer 120 is formed on the substrate 110. The lower buffer layer 120 is intended for blocking moisture that may flow from the outside, and may be embodied as a single layer composed of a silicon oxide ($SiO_2$) film or a silicon nitride (SiN) film, or a stack of multiple layers made of a silicon oxide ($SiO_2$) film and a silicon nitride (SiN) film. However, the present disclosure is not limited thereto. For example, the lower buffer layer 120 may have a stack structure of a first lower buffer layer 130 and a second lower buffer layer 140 in order to increase the moisture blocking power against the externally flowing moisture.

The fourth thin-film transistor 350 may be formed in the gate driver 115 of the non-display area NA of the substrate 110. The fourth thin-film transistor 350 may include a fourth semiconductor layer 352 including a channel through which electrons or holes travel, a fourth gate electrode 351, a fourth source electrode 354, and a fourth drain electrode 355. The fourth thin-film transistor 350 may include the fourth semiconductor layer 352 as the polycrystalline semiconductor layer.

The fourth semiconductor layer 352 may be made of a polycrystalline semiconductor material. A fourth channel area 352C may be formed in a middle area of the fourth semiconductor layer 352. A fourth source area 352S and a fourth drain 352D are respectively disposed on both opposing sides of the fourth channel area 352C interposed therebetween.

The fourth channel area 352C is made of a polycrystalline semiconductor material maintaining an intrinsic state, and may provide a path along which electrons or holes travel.

Each of the fourth source area 352S and the fourth drain area 352D may be an area in which an intrinsic polycrystalline semiconductor material is doped with group V or group III impurity ions, for example, phosphorus (P) or boron (B) at a predetermined concentration to make the area conductive.

The fourth thin-film transistor 350 may include the fourth gate electrode 351 configured to overlap the fourth channel area 352C of the fourth semiconductor layer 352. A first gate insulating layer 210 is interposed between the fourth gate electrode 351 and the fourth semiconductor layer 352.

According to an embodiment of the present disclosure, the fourth thin-film transistor 350 has a top gate scheme in which the fourth gate electrode 351 is located on top of the fourth semiconductor layer 352. Accordingly, a first capacitor electrode 341, light-blocking layers 321 and 331, and the fourth gate electrode 351 may be made of the same material and may be formed in one mask process. Thus, an effect of shortening a process may be obtained.

The fourth gate electrode 351, the first capacitor electrode 341 or the light-blocking layers 321 and 331 may be made of a metal material. For example, the fourth gate electrode 351, the first capacitor electrode 341 or the light-blocking layers 321 and 331 may be embodied as, for example, a single layer made of one of molybdenum (Mo), aluminum (Al), chromium (Cr), gold (Au), titanium (Ti), nickel (Ni), neodymium (Nd) and copper (Cu) or alloys thereof, or a stack of multiple layers made of molybdenum (Mo), aluminum (Al), chromium (Cr), gold (Au), titanium (Ti), nickel (Ni), neodymium (Nd), copper (Cu) and/or alloys thereof. However, the present disclosure is not limited thereto.

A first interlayer insulating layer 220 is disposed on the fourth gate electrode 351. The first interlayer insulating layer 220 may be made of silicon nitride (SiNx). For example, the first interlayer insulating layer 220 made of silicon nitride (SiNx) may contain hydrogen. When the fourth semiconductor layer 352 is formed and the first interlayer insulating layer 220 is deposited thereon and then a heat treatment process is performed thereon, the hydrogen contained in the first interlayer insulating layer 220 may penetrate into the fourth source area 352S and the fourth drain area 352D to contribute to improving and stabilizing the conductivity of the polycrystalline semiconductor material. This may be referred to as a hydrogenation process.

The fourth thin-film transistor 350 may further include a first upper buffer layer 230, a second upper buffer layer 240, a second gate insulating layer 250, and a second interlayer insulating layer 260 sequentially disposed on the first interlayer insulating layer 220. The fourth thin-film transistor 350 may include the fourth source electrode 354 and the fourth drain electrode 355 formed on the second interlayer insulating layer 260 and connected to the fourth source area 352S and the fourth drain area 352D, respectively.

The first upper buffer layer 230 may isolate the fourth semiconductor layer 352 of the non-display area NA made of the polycrystalline semiconductor material and semiconductor layers 312, 322, and 332 of the thin-film transistors of the display area AA made of the oxide semiconductor material from each other. The first upper buffer layer 230 may provide a base on which the semiconductor layers 312, 322, and 332 of the thin-film transistors of the display area AA are formed.

The second interlayer insulating layer 260 is an interlayer insulating layer that covers a first gate electrode 313 of the first thin-film transistor 310, a second gate electrode 323 of the second thin-film transistor 320, and a third gate electrode 333 of the third thin-film transistor 330. Since the second interlayer insulating layer 260 or the second gate insulating layer 250 is formed on the first semiconductor layer 312, the second semiconductor layer 322, and the third semiconductor layer 332 made of the oxide semiconductor material, the second interlayer insulating layer 260 or the second gate insulating layer 250 may be embodied as an inorganic film that does not contain hydrogen.

Each of the fourth source electrode 354 and the fourth drain electrode 355 may be embodied as, for example, a single layer made of one of molybdenum (Mo), aluminum (Al), chromium (Cr), gold (Au), titanium (Ti), nickel (Ni), neodymium (Nd) and copper (Cu) or alloys thereof, or a stack of multiple layers made of molybdenum (Mo), aluminum (Al), chromium (Cr), gold (Au), titanium (Ti), nickel (Ni), neodymium (Nd), copper (Cu) and/or alloys thereof. However, the present disclosure is not limited thereto.

The first thin-film transistor 310, the second thin-film transistor 320, the third thin-film transistor 330, and the storage capacitor 340 or Cst may be included in the pixel driver circuit of the substrate 110.

The first thin-film transistor 310 according to the present disclosure is formed on the first upper buffer layer 230. The first thin-film transistor 310 may provide a driving current to the light-emitting element ED according to a data voltage applied from the data line DL. The first thin-film transistor 310 may include an oxide semiconductor layer or a polycrystalline semiconductor layer as the first semiconductor layer 312.

The thin-film transistor including the polycrystalline semiconductor layer generates leakage current in an off state, and thus, power consumption thereof may be greater than that of the thin-film transistor including the oxide semiconductor layer. The thin-film transistor using the oxide semiconductor layer as the semiconductor layer may undergo deterioration resulting from the light incident on the semiconductor layer, due to the material characteristics of the oxide semiconductor. In the display apparatus according to an embodiment of the present disclosure in which the semiconductor layer of the thin-film transistor of the display area AA is composed of the oxide semiconductor layer that has a very small leakage current and can reduce power consumption, a structure that reduces degradation of the thin-film transistor due to the light incident on the semiconductor layer is proposed.

The first thin-film transistor 310 according to the present disclosure may include the first semiconductor layer 312 as an oxide semiconductor layer. The first thin-film transistor 310 may include the first semiconductor layer 312 composed of the oxide semiconductor layer, a second gate insulating layer 250 covering the first semiconductor layer 312, the first upper gate electrode 313 formed on the second gate insulating layer 250 and overlapping the first semiconductor layer 312, the second interlayer insulating layer 260 formed on the second gate insulating layer 250 and covering the first upper gate electrode 313, and a first source electrode 314 and a first drain electrode 315 disposed on the second interlayer insulating layer 260.

The first thin-film transistor 310 further includes a first lower gate electrode (or a first lower light-blocking layer) 311 disposed between the first upper buffer layer 230 and the second upper buffer layer 240 and overlapping the first semiconductor layer 312. The first lower gate electrode 311 may be inserted into the first upper buffer layer 230. For example, the first lower gate electrode 311 is formed on the first upper buffer layer 230 disposed on the first interlayer insulating layer 220. The second upper buffer layer 240 is formed on the first lower gate electrode 311 and the first upper buffer layer 230.

The first upper buffer layer 230 may be made of silicon oxide ($SiO_2$). The first upper buffer layer 230 is made of silicon oxide ($SiO_2$) that does not contain hydrogen. Thus, the first upper buffer layer 230 may act as a base on which the first thin-film transistor 310 using the oxide semiconductor layer whose reliability may be damaged by hydrogen as the first semiconductor layer 312 is disposed.

The second upper buffer layer 240 may be made of silicon nitride (SiNx) or silicon oxide ($SiO_2$). The second upper buffer layer 240 may cover both upper and side surfaces of the first lower gate electrode 311 so as to entirely seal the first lower gate electrode 311.

The first interlayer insulating layer 220 containing hydrogen is located under the first upper buffer layer 230. The hydrogen generated during the hydrogenation process of the fourth thin-film transistor 350 including the fourth semiconductor layer 352 as the polycrystalline semiconductor layer may travel through the first upper buffer layer 230 and may damage reliability of the oxide semiconductor layer positioned on the first upper buffer layer 230. For example, when hydrogen invades the oxide semiconductor layer, a corresponding thin-film transistor having the oxide semiconductor layer has a changed threshold voltage. Thus, the conductivity of the channel is changed. In this regard, when the corresponding thin-film transistor acts as a driving transistor, it is important to secure the reliability thereof because the driving transistor directly contributes to an operation of the light-emitting element.

In the first thin-film transistor 310 according to an embodiment of the present disclosure, the first lower gate electrode 311 may be composed of a metal layer including a titanium (Ti) material having excellent hydrogen trapping ability. For example, the first lower gate electrode 311 may be embodied as a single layer made of titanium (Ti), a stack of a molybdenum (Mo) layer and a titanium (Ti) layer, or a single layer made of an alloy of molybdenum (Mo) and titanium (Ti). However, the present disclosure is not limited thereto.

The titanium (Ti) traps hydrogen diffusing within the first upper buffer layer 230 and prevents hydrogen from reaching the first semiconductor layer 312. The first thin-film transistor 310 according to an embodiment of the present disclosure includes the first lower gate electrode 311 composed of a metal layer made of titanium (Ti) having the ability to capture hydrogen. In addition, the second upper buffer layer 240 may be made of silicon nitride (SiNx) having the ability to capture the hydrogen and may surround the first lower gate electrode 311. The reliability of the oxide semiconductor layer may be prevented from being damaged by hydrogen.

The first source electrode 314 of the first thin-film transistor 310 may be electrically connected to the first lower gate electrode 311. Since an effective voltage applied to the channel area 312C of the first semiconductor layer 312 is inversely proportional to parasitic capacitance between the first semiconductor layer 312 and the first lower gate electrode 311, the effective voltage applied to the first semiconductor layer 312 may be adjusted. For example, when the first lower gate electrode 311 is placed close to the first semiconductor layer 312 so as to increase the parasitic capacitance value therebetween, an actual current value flowing through the first semiconductor layer 312 may be reduced. This may widen a control range in which the first thin-film transistor 310 can be controlled based on a voltage applied to the first upper gate electrode 313. As a result, the light-emitting element can be precisely controlled at a low gray-scale, and thus, screen stains may be removed.

The pixel driver circuit of the display area AA according to an embodiment of the present disclosure may include the storage capacitor 340 or Cst. The storage capacitor 340 stores therein the data voltage applied thereto via the data line DL for a certain period of time and provides the data voltage to the light-emitting element ED.

The storage capacitor 340 is composed of two electrodes facing each other and a dielectric layer disposed therebetween. The storage capacitor 340 may include the first capacitor electrode 341 and a second capacitor electrode 343. The first capacitor electrode 341 and the fourth gate electrode 351 may be disposed on the same layer and may be made of the same material. The second capacitor electrode 343 and the first lower gate electrode 311 may be disposed on the same layer and may be made of the same material. The first interlayer insulating layer 220 may be disposed between the first capacitor electrode 341 and the second capacitor electrode 343. The second capacitor electrode 343 of the storage capacitor 340 may be electrically connected to the first source electrode 314.

The pixel driver circuit of the display area AA according to an embodiment of the present disclosure may include the second thin-film transistor 320 (or the first switching transistor T1).

The second thin-film transistor 320 is turned on based on the first scan signal SC1 applied via the gate line GL, and applies an operation signal to the first node N1 as the gate node of the first thin-film transistor 310, so that the first thin-film transistor 310 may operate.

The second thin-film transistor 320 may include the second semiconductor layer 322 formed on the first upper buffer layer 230 and composed of an oxide semiconductor layer, the second gate insulating layer 250 covering the second semiconductor layer 322, the second interlayer insulating layer 260 formed on the second gate insulating layer 250, and a second source electrode 324 and a second drain electrode 325 formed on the second interlayer insulating layer 260.

The second thin-film transistor 320 may further include the second lower gate electrode 321 (or the second lower light-blocking layer) disposed under the first upper buffer layer 230 and overlapping the second semiconductor layer 322. For example, the second lower gate electrode 321 may be made of the same material as that of the fourth gate electrode 351 and may be formed on an upper surface of the first gate insulating layer 210. The second lower gate electrode 321 may be electrically connected to the second upper gate electrode 323 to constitute a dual gate (or a double gate). Since the second thin-film transistor 320 has the dual gate structure, flow of current in a second channel area 322C of the second semiconductor layer 322 may be more precisely controlled. Further, the second thin-film transistor 320 may be disposed in a smaller area, such that a high-resolution display apparatus may be implemented.

The second semiconductor layer 322 is made of an oxide semiconductor material, and includes the intrinsic second channel area 322C undoped with impurities, and a second source area 322S and a second drain area 322D doped with impurities so as to be conductive.

A distance between the second semiconductor layer 322 and the second lower gate electrode 321 may be greater than a distance between the first semiconductor layer 312 and the first lower gate electrode 311. Each thin film transistor may have different needs for precise control through a dual gate according to its unique function.

Each of the second source electrode 324 and the second drain electrode 325 may be embodied as, for example, a single layer made of one of molybdenum (Mo), aluminum (Al), chromium (Cr), gold (Au), titanium (Ti), nickel (Ni), neodymium (Nd) and copper (Cu) or alloys thereof, or a stack of multiple layers made of molybdenum (Mo), aluminum (Al), chromium (Cr), gold (Au), titanium (Ti), nickel (Ni), neodymium (Nd), copper (Cu) and/or alloys thereof. However, the present disclosure is not limited thereto.

The second source electrode 324, the second drain electrode 325, the fourth source electrode 354, and the fourth drain electrode 355 may be simultaneously formed on the second interlayer insulating layer 260 and may be made of the same material, thereby reducing the number of mask processes.

The pixel driver circuit of the display area AA according to an embodiment of the present disclosure may include the third thin-film transistor 330 (or the fifth switching transistor T5).

The third thin-film transistor 330 may include the third semiconductor layer 332 formed on the second upper buffer layer 240 and may be composed of an oxide semiconductor layer, the second gate insulating layer 250 covering the third semiconductor layer 332, the third upper gate electrode 333 formed on the second gate insulating layer 250 and overlapping the third semiconductor layer 332, the second interlayer insulating layer 260 covering the third upper gate electrode 333, and a third source electrode 334 and a third drain electrode 335 formed on the second interlayer insulating layer 260.

The third drain electrode 335 may be electrically connected to the first source electrode 314 of the first thin-film transistor 310, and the third source electrode 334 may be electrically connected to the light-emitting element ED. Thus, the driving current may be supplied to the light-emitting element ED via the third thin-film transistor 330. The third thin-film transistor 330 may be controlled based on the first light-emission control signal EM1 and may block the supply of the driving current to the light-emitting element ED.

The third thin-film transistor 330 may further include the third lower gate electrode (or the third lower light-blocking layer) 331 disposed under the first upper buffer layer 230, and overlapping the third semiconductor layer 332. In particular, the third lower gate electrode 331 and the fourth gate electrode 351 may be made of the same material and may be formed on an upper surface of the first gate insulating layer 210. The third lower gate electrode 331 may be electrically connected to the third upper gate electrode 333 to constitute a dual gate. Since the third thin-film transistor 330 has the dual gate structure, flow of current in a third channel area 332C of the third semiconductor layer 332 may be more precisely controlled. Further, the third thin-film transistor 330 may be disposed in a smaller area, such that a high-resolution display apparatus may be implemented.

The third semiconductor layer 332 is made of an oxide semiconductor material, and includes the intrinsic third channel area 332C undoped with the impurity and a third source area 332S and a third drain area 332D doped with the impurity so as to be conductive.

A distance between the third semiconductor layer 332 and the third lower gate electrode 331 may be greater than a distance between the first semiconductor layer 312 and the first lower gate electrode 311. Each thin film transistor may have different needs for precise control through a dual gate according to its unique function. For example, a ratio of a change amount in a current amount of the light-emitting element ED to a change amount in the threshold voltage of the third thin-film transistor 330 may be larger than a ratio of a change amount in a current amount of the light-emitting element ED to a change amount in the threshold voltage of the first thin-film transistor 310, so more precise control of the third thin-film transistor 330 is required. For precise control of the current amount of the light-emitting element ED, the distance between the first semiconductor layer 312 and the first lower gate electrode 311 may be smaller than the distance between the third semiconductor layer 332 and the third lower gate electrode 331.

Each of the third source electrode 334, the third drain electrode 335, the fourth source electrode 354, and the fourth drain electrode 355 may be embodied as, for example, a single layer made of one of molybdenum (Mo), aluminum (Al), chromium (Cr), gold (Au), titanium (Ti), nickel (Ni), neodymium (Nd) and copper (Cu) or alloys thereof, or a stack of multiple layers made of molybdenum (Mo), aluminum (Al), chromium (Cr), gold (Au), titanium (Ti), nickel (Ni), neodymium (Nd), copper (Cu) and/or alloys thereof. However, the present disclosure is not limited thereto.

According to an embodiment of the present disclosure, each of the first upper gate electrode 313, the second upper gate electrode 323, and the third upper gate electrode 333 may include a lower portion made of titanium (Ti), and an upper portion made of a metal such as molybdenum (Mo) different from titanium (Ti) and thus may have a multi-layer structure. However, embodiments of the present disclosure are not limited thereto.

When each of the upper gate electrodes 313, 323, and 333 is composed of a plurality of metal layers including titanium (Ti), the metal layer including titanium (Ti) can block hydrogen falling downwardly from a position above from each of the thin-film transistors 310, 320, and 330 to protect each of the semiconductor layers 312, 322, and 332.

A first planarization layer 270 and a second planarization layer 280 may be sequentially formed at a top of the pixel driver circuit according to an embodiment of the present disclosure so as to remove steps caused by differences between heights of the various components. Each of the first planarization layer 270 and the second planarization layer 280 may be composed of an organic film made of polyimide or acrylate resin. However, embodiments of the present disclosure are not limited thereto.

The light-emitting element ED is formed on the second planarization layer 280. The light-emitting element ED may include the first electrode (or anode electrode) 410, the second electrode (or cathode electrode) 430 opposite to the first electrode 410, and the light-emissive layer 420 positioned between the first electrode 410 and the second electrode 430. Each of the first electrode 410 and the light-emissive layer 420 may be individually disposed in each sub-pixel PX, while the second electrode 430 may be formed along the entire area of the display area AA.

The light-emitting element ED may be connected to the pixel driver circuit via a first connection electrode 360 formed on the first planarization layer 270. For example, the first electrode 410 of the light-emitting element ED and the first drain electrode 315 of the first thin-film transistor 310 constituting the pixel driver circuit or the third source electrode 334 of the third thin-film transistor 330 constituting the pixel driver circuit may be connected to each other via the first connection electrode 360.

The first electrode 410 may be connected to the first connection electrode 360 via a contact-hole extending through the second planarization layer 280. The first connection electrode 360 may be connected to the third source electrode 334 via a contact-hole extending through the first planarization layer 270.

The first electrode 410 may be formed in a multi-layer structure including a transparent conductive film or an opaque conductive film having high reflective efficiency. The transparent conductive film is made of a material with a relatively large work function value such as indium-tin-oxide (ITO) or indium-zinc-oxide (IZO). The opaque conductive film may be composed of a single layer or multi-layer structure including aluminum (Al), silver (Ag), copper (Cu), lead (Pb), molybdenum (Mo), titanium (Ti) or alloys thereof. Embodiments of the present disclosure are not limited thereto. For example, the first electrode 410 may have a structure in which a transparent conductive film, an opaque conductive film, and a transparent conductive film are sequentially stacked, or may have a structure in which a transparent conductive film and an opaque conductive film are sequentially stacked. Embodiments of the present disclosure are not limited thereto.

The light-emissive layer 420 may be formed by stacking a hole-related layer, an organic light-emissive layer, and an electron-related layer on the first electrode 410 in this order or a reverse order.

A bank layer 290 may act as a pixel definition layer exposing the first electrode 410 of each sub-pixel PX. The bank layer 290 may be made of an opaque material to prevent optical interference between adjacent sub-pixels PX. For example, the bank layer 290 may include a light blocking material made of any one of color pigment, organic black, and carbon. A spacer 440 may be further disposed on the bank layer 290.

The second electrode 430 may face the first electrode 410 while the light-emissive layer 420 is interposed therebetween and may be formed on top and side surfaces of the light-emissive layer 420. The second electrode 430 may be continuous along an entirety of the display area AA. When the second electrode 430 is applied to a top-emission organic light-emitting display apparatus, the second electrode 430 may be composed of a transparent conductive film made of indium-tin-oxide (ITO) or indium-zinc-oxide (IZO).

An encapsulation portion 600 may be further disposed on the second electrode 430 to suppress moisture permeation. The encapsulation portion 600 may include a first encapsulation layer 610, a second encapsulation layer 620, and a third encapsulation layer 630 sequentially stacked. However, embodiments of the present disclosure are not limited thereto.

Each of the first encapsulation layer 610 and the third encapsulation layer 630 of the encapsulation portion 600 may be made of an inorganic material such as silicon oxide (SiOx). The second encapsulation layer 620 of the encapsulation portion 600 may be made of an organic material such as acryl resin, epoxy resin, phenolic resin, polyamide resin, and polyimide resin. Embodiments of the present disclosure are not limited thereto.

A touch unit (or a touch sensor unit) may be further disposed on the encapsulation portion 600. The touch unit is composed of a touch buffer layer, a touch insulating layer, and a touch protection layer, and includes a plurality of touch electrodes and a plurality of connection electrodes.

External light L or internal light L may be incident to the pixel driver circuit inside the display apparatus 10. Light L in FIG. 6 represents light incident from an outside out of the display apparatus 10 thereto. However, light L may be light emitted from the light-emitting element ED inside the display apparatus 10. However, the present disclosure is not limited thereto.

When the thin-film transistor uses an oxide semiconductor material as a material of the semiconductor layer, deterioration thereof may occur due to light incident onto the semiconductor layer, based on the material characteristics of the oxide semiconductor material. The oxide semiconductor layer thin-film transistor has excellent leakage current characteristics compared to the polycrystalline semiconductor layer thin-film transistor, but has degradation due to light, so that a change in a threshold voltage occurs, and the leakage current characteristics is changed.

The light L may be incident through a front surface of the display apparatus 10 or through the substrate 110 at a back side of the display apparatus 10. The light entering the inside of the display apparatus 10 may travel through the first and second planarization layers 270 and 280, the second interlayer insulating layer 260, the second gate insulating layer 250, the first and second upper buffer layers 230 and 240, the first interlayer insulating layer 220 and the first gate insulating layer 210. In this process, a portion of the light may be transmitted through or is reflected at an interface between adjacent layers. A portion of the light reflected at each interface may be repeatedly reflected to affect the semiconductor layer of each thin-film transistor.

According to an embodiment of the present disclosure, the light-blocking layer 500 may be formed to prevent the light L from being incident onto the semiconductor layer. The light-blocking layer 500 and the first electrode 410 may be disposed in the same layer and may be formed on the first thin-film transistor 310 or the second thin-film transistor 320, while the light-blocking layer 500 may overlap the first thin-film transistor 310 and/or the second thin-film transistor 320.

The light-blocking layer 500 may be made of a single-layer or multi-layer structure including aluminum (Al), silver (Ag), copper (Cu), lead (Pb), molybdenum (Mo), titanium (Ti), or an alloy thereof, and may be made of the same material as that of the first electrode 410. The light L may be reflected from or absorbed by the light-blocking layer 500. The material of the light-blocking layer 500 does not limit the contents of the present disclosure.

The light-blocking layer 500 may be connected to the second electrode 430 in the display area AA. The second electrode 430 may be formed along the entirety of the display area AA. In an area where the light-blocking layer 500 is disposed, the light-blocking layer 500 and the second electrode 430 may be electrically connected to each other via a second electrode contact-hole 430H.

The second electrode contact-hole 430H may be formed by removing a portion of the bank layer 290 disposed between the second electrode 430 and the light-blocking layer 500. The second electrode contact-hole 430H may be defined in the bank layer 290, and a portion of the second electrode 430 may fill the second electrode contact-hole 430H so as to connect the second electrode 430 and the light-blocking layer 500 to each other.

In the non-display area NA, the second electrode 430 may be connected to the common voltage line 370, so that the second driving voltage EVSS may be applied thereto. The common voltage line 370 may be connected to an end area of the second electrode 430.

When the common voltage line 370 is connected only to the end area of the second electrode 430 while not being connected to the light-blocking layer 500, the second driving voltage EVSS as a low potential voltage is not uniformly distributed over an entire area of the second electrode 430, and thus a phenomenon in which the second driving voltage decreases toward a central area of the second electrode 430 may occur.

In order that the second driving voltage EVSS is uniformly distributed over the entire area of the second electrode 430, the light-blocking layer 500 disposed in the display area AA may extend into the non-display area NA and may be connected to the common voltage line 370. In addition, the light-blocking layer 500 may be electrically connected to the second electrode 430 in a plurality of areas in the display area AA such that the second driving voltage EVSS is uniformly applied to the second electrode 430.

For example, the common voltage line 370 disposed in the non-display area NA may be connected to the second electrode 430 and the light-blocking layer 500. The second driving voltage EVSS may be applied to the second electrode 430 via the light-blocking layer 500.

In order to connect the light-blocking layer 500 and the common voltage line 370 to each other, a second connection electrode 380 may be formed in a partial area of the first planarization layer 270 so as to connect the light-blocking layer 500 and the common voltage line 370 to each other. The second connection electrode 380 may be made of the same material as that of the first connection electrode 360, while the second connection electrode 380 and the first connection electrode 360 may be formed in the same process.

The light-blocking layer 500 and the second electrode 430 may be connected to each other in multiple areas spaced from each other by a uniform spacing throughout the display area AA. The second electrode contact-hole 430H connecting the light-blocking layer 500 and the second electrode 430 to each other may be formed in multiple areas to apply the second driving voltage EVSS to the second electrode 430. Thus, the second driving voltage EVSS can be uniformly distributed over the second electrode 430.

Figure 7:
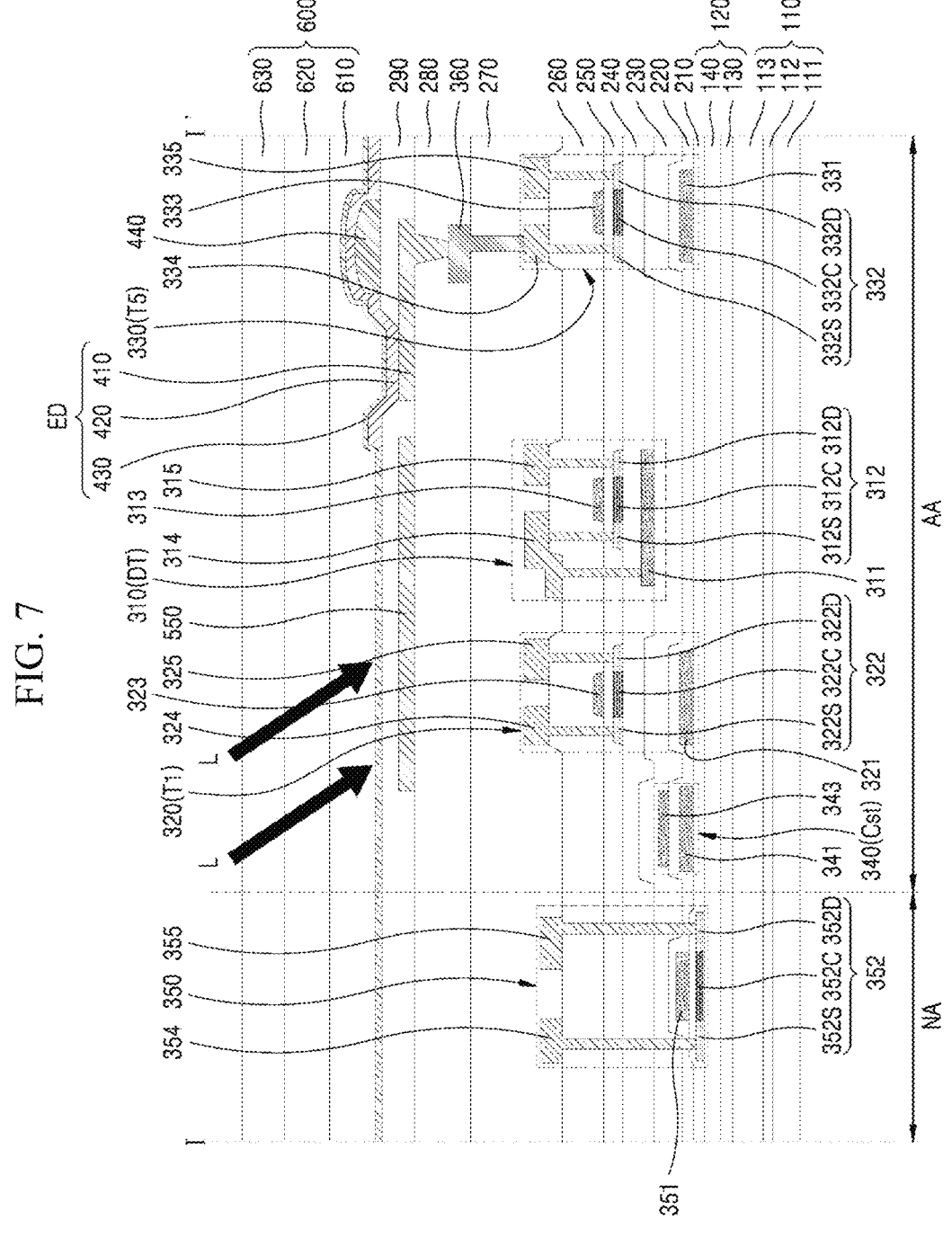
FIG. 7 is a cross-sectional view along a line I-I' of FIG. 1, and is a cross-sectional view showing a thin-film transistor and a light-blocking layer according to the embodiment of FIG. 5.

FIG. 7 is a cross-sectional view taken along a line I-I' of FIG. 1. FIG. 7 shows a thin-film transistor and a light-blocking layer according to the embodiment of FIG. 5 of the present disclosure. The components in FIG. 7 are substantially the same as those in FIG. 6. Thus, the descriptions of the same components may be omitted or simplified.

Referring to FIG. 7, the display apparatus 10 includes the pixel driver circuit including the first thin-film transistor 310 (or the driving transistor DT), the second thin-film transistor 320 (or the first switching transistor T1), and the third thin-film transistor 330 (or the third switching transistor T5), and the light-emitting element ED. Each of the pixel driver circuit and the light-emitting element ED may have the same structure as each of those in FIG. 6.

The light-blocking layer 550 may be formed on the thin-film transistors 310, 320, and 330 so as to overlap one or more of the thin-film transistors 310, 320, and 330. The light-blocking layer 550 may be made of the same material as that of the first electrode 410 and may be formed in the same layer as a layer in which the first electrode 410 is disposed. The light-blocking layer 550 may be disposed between the second planarization layer 280 and the bank layer 290, and may be larger than the underlying thin-film transistors so as to prevent the light L from being incident on the semiconductor layers 312, 322, and 332.

According to an embodiment of the present disclosure, the light-blocking layer 550 may be freely formed while not being connected to other components. For example, the light-blocking layer 550 may overlap with the first thin-film transistor 310 and the second thin-film transistor 320 which can deteriorate more rapidly, and may not overlap the third thin-film transistor 330 which deteriorates in a relatively slower manner. In this way, the light-blocking layer 550 may selectively overlap the thin-film transistors such that the deteriorations of all thin-film transistors may be substantially equal to each other.

A position where the light-blocking layer 550 is disposed is not limited thereto. The light-blocking layer 550 may overlap at least one thin-film transistor onto which light L should be intensively prevented from being incident.

A display apparatus according to the present disclosure may be described as follows.

A first aspect of the present disclosure provides a display apparatus comprising: a substrate including a display area and a non-display area; a gate line and a data line disposed on the substrate, wherein the gate line and the data line intersect each other; a plurality of light-emitting elements disposed on the gate line and the data line, wherein each of the plurality of light-emitting elements includes a first electrode, a light-emissive layer, and a second electrode; and a first thin-film transistor and a second thin-film transistor disposed under each of the plurality of light-emitting elements.

In this regard, the display apparatus further comprises a light-blocking layer disposed on the first thin-film transistor or the second thin-film transistor, wherein the light-blocking layer and the first electrode are disposed at the same vertical level, wherein the light-blocking layer overlaps at least one of the first thin-film transistor and the second thin-film transistor.

According to some implementations of the present disclosure, the light-blocking layer is spaced from the first electrode.

According to some implementations of the present disclosure, the light-blocking layer and the first electrode include the same material.

According to some implementations of the present disclosure, in the display area, the light-blocking layer is connected to the second electrode.

According to some implementations of the present disclosure, the display apparatus further comprises a common voltage line disposed on the substrate and in the non-display area, wherein the common voltage line is connected to the second electrode and the light-blocking layer.

According to some implementations of the present disclosure, the light-blocking layer extends continuously and is disposed between adjacent ones of the plurality of light-emitting elements and has a line shape.

According to some implementations of the present disclosure, the light-blocking layer non-overlaps the first thin-film transistor and overlaps with the second thin-film transistor.

According to some implementations of the present disclosure, the first thin-film transistor acts as a driving transistor, wherein the second thin-film transistor acts as a switching transistor.

According to some implementations of the present disclosure, the first thin-film transistor includes a first semiconductor layer, wherein the second thin-film transistor includes a second semiconductor layer, wherein each of the first semiconductor layer and the second semiconductor layer is made of an oxide semiconductor layer.

According to some implementations of the present disclosure, the display apparatus further comprises a third thin-film transistor connected to the first thin-film transistor and the light-emitting element, wherein the third thin-film transistor is configured to supply driving current to the light-emitting element.

According to some implementations of the present disclosure, the display apparatus further comprises a gate driver disposed in the non-display area and supplying a gate signal to the gate line; and a fourth thin-film transistor included in the gate driver and having a fourth semiconductor layer, wherein the fourth semiconductor layer is made of a polycrystalline semiconductor layer.

A second aspect of the present disclosure provides a display apparatus comprising: a substrate including a display area and a non-display area; a gate line and a data line disposed on the substrate, wherein the gate line and the data line intersect each other; a plurality of light-emitting elements disposed on the gate line and the data line, wherein each of the plurality of light-emitting elements includes a first electrode, a light-emissive layer, and a second electrode;

and a driving transistor and a plurality of switching transistors disposed under each of the plurality of light-emitting elements.

In this regard, the display apparatus further comprises a light-blocking layer disposed on the driving transistor or the plurality of switching transistor, wherein the light-blocking layer and the first electrode are disposed at the same vertical level, wherein the light-blocking layer overlaps one of the plurality of switching transistors.

According to some implementations of the present disclosure, the light-blocking layer extends continuously and is disposed between adjacent ones of the plurality of light-emitting elements and has a line shape.

According to some implementations of the present disclosure, the light-blocking layer non-overlaps with the others of the plurality of switching transistors except for the one of the plurality of switching transistors.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus comprising:
   a substrate including a display area and a non-display area;
   a gate line and a data line disposed on the substrate, wherein the gate line and the data line intersect each other;
   a plurality of light-emitting elements disposed on the gate line and the data line, wherein each of the plurality of light-emitting elements includes a first electrode, a light-emissive layer, and a second electrode;
   a driving transistor and a plurality of switching transistors disposed under each of the plurality of light-emitting elements; and
   a light-blocking layer disposed on the driving transistor and the plurality of switching transistors,
   wherein the light-blocking layer and the first electrode are disposed at a same vertical level,
   wherein the light-blocking layer overlaps the driving transistor and one of the plurality of switching transistors, and does not overlap the others of the plurality of switching transistors except for the one of the plurality of switching transistors, and
   wherein the driving transistor includes a first semiconductor layer composed of an oxide semiconductor layer, and the one of the plurality of switching transistors includes a second semiconductor layer composed of an oxide semiconductor layer.

2. The display apparatus of claim 1, wherein the light-blocking layer is spaced from the first electrode.

3. The display apparatus of claim 1, wherein the light-blocking layer and the first electrode include a same material.

4. The display apparatus of claim 1, wherein the one of the plurality of switching transistors is connected to a gate electrode and a drain electrode of the driving transistor.

5. The display apparatus of claim 1, wherein at least one of the others of the plurality of switching transistors are placed under and overlaps the first electrode.

6. The display apparatus of claim 1, wherein the driving transistor further include a first lower light-blocking layer disposed under the first semiconductor layer, and the one of the plurality of switching transistors further include a second lower light-blocking layer disposed under the second semiconductor layer.

7. The display apparatus of claim 1, further comprising:

a gate driver disposed in the non-display area and supplying a gate signal to the gate line; and a thin-film transistor included in the gate driver and having a fourth semiconductor layer, wherein the fourth semiconductor layer is made of a polycrystalline semiconductor layer.

8. The display apparatus of claim 7, wherein the light-blocking layer does not overlap the thin-film transistor.

\* \* \* \* \*